United States Patent

Yokotani et al.

[11] Patent Number: 5,512,353
[45] Date of Patent: Apr. 30, 1996

[54] CERAMIC SUBSTRATE FOR AN ELECTRONIC CIRCUIT

[75] Inventors: Yoichiro Yokotani, Suita; Hamae Ando, Neyagawa; Koichi Kugimiya, Toyonaka, all of Japan

[73] Assignee: Matsushita Electric Industrial Co., Ltd., Osaka, Japan

[21] Appl. No.: 263,157

[22] Filed: Jun. 20, 1994

Related U.S. Application Data

[63] Continuation of Ser. No. 809,985, Dec. 18, 1991, abandoned.

[30] Foreign Application Priority Data

Dec. 21, 1990 [JP] Japan .................................. 2-404856

[51] Int. Cl.$^6$ ...................................................... B32B 9/00
[52] U.S. Cl. ........................ 428/210; 428/432; 428/433; 428/901; 361/321.1; 361/321.2; 501/134; 501/135
[58] Field of Search ........................ 428/210, 432, 428/433; 361/321.1, 321.2; 501/134, 135

[56] References Cited

U.S. PATENT DOCUMENTS

| | | | |
|---|---|---|---|
| 3,075,860 | 1/1963 | Veres | 174/259 |
| 4,503,090 | 3/1985 | Brown et al. | 427/96 |
| 4,714,570 | 12/1987 | Nakatani et al. | 252/518 |
| 4,724,182 | 2/1988 | Kato et al. | 428/901 |
| 4,863,683 | 9/1989 | Nakatani et al. | 419/10 |
| 4,885,661 | 12/1989 | Yokotani et al. | 361/321 |
| 5,004,715 | 4/1991 | Hakotani et al. | 501/136 |
| 5,036,167 | 7/1991 | Kasai | 174/258 |

FOREIGN PATENT DOCUMENTS

| | | |
|---|---|---|
| 0332457 | 10/1989 | European Pat. Off. . |
| 51-11793 | 4/1976 | Japan . |
| 51-11795 | 4/1976 | Japan . |
| 51-26640 | 8/1976 | Japan . |
| 62-031906 | 2/1987 | Japan . |
| 1-258307 | 10/1989 | Japan . |
| 1-293595 | 11/1989 | Japan . |
| 2303107 | 12/1990 | Japan . |

*Primary Examiner*—Patrick J. Ryan
*Assistant Examiner*—Kam F. Lee
*Attorney, Agent, or Firm*—Panitch Schwarze Jacobs & Nadel

[57] ABSTRACT

The ceramic substrate for electronic circuit of the present invention comprises a ceramic layer and a conductive layer which is patterned on the ceramic layer, wherein the conductive layer comprises copper or an alloy containing copper as its main component. The ceramic layer entirely comprises a complex oxide or an oxide solid solution containing copper element and at least one component excluding copper element. Moreover, the ceramic layer is insulated.

11 Claims, 3 Drawing Sheets

Fig. 2C

CERAMIC SUBSTRATE FOR AN ELECTRONIC CIRCUIT

This is a continuation of application Ser. No. 07/809,985, filed Dec. 18, 1991, now abandoned.

BACKGROUND OF THE INVENTION

1. Field of the Invention

The present invention relates to a ceramic substrate for electronic circuit using, as a conductive metal, copper or an alloy containing copper as its main component and a method for producing the same. More particularly, it relates to a ceramic substrate for electronic circuit in which a special composition is used for a ceramic layer in a ceramic substrate for multilayer electronic circuit or for an insulated layer in a ceramic substrate for printed electronic circuit.

2. Description of the Prior Art

In recent years, there has been a great demand for a ceramic substrate for electronic circuit since it is required that a circuit element or a semiconductor device be highly integrated and a circuit substrate be made highly reliable.

As a ceramic substrate for electronic circuit, there are a substrate for multilayer electronic circuit obtained by patterning a conductive layer on unfired ceramic green sheets, laminating the resulting green sheets, followed by firing them together; a substrate for printed electronic circuit obtained by forming a conductive layer, an insulated layer, and another conductive layer on a sintered ceramic substrate in this order so that the insulated layer is sandwiched between both conductive layers; and the like. The substrate for multilayer electronic circuit is used as a substrate which is required to be highly integrated such as a circuit substrate on which an LSI chip or the like is mounted. The substrate for printed electronic circuit is used as a substrate of a hybrid IC or the like in which functional elements such as a resistor and a capacitor are further formed on the substrate.

In the past, as a ceramic material used for ceramic substrates for electronic circuit, an alumina type material, a glass ceramic type material, or the like has been used. In particular, as a method for a ceramic substrate similar to the present invention, Japanese Patent Publication Nos. 51-11795, 51-11793, 51-26640, etc. disclose materials obtained by adding a copper oxide to alumina is used.

As a material for a conductive layer, tungsten, molybdenum, or the like is used in the case of a substrate for multilayer electronic circuit; and a gold or silver type material is used in the case of a ceramic substrate for printed electronic circuit. However, tungsten, molybdenum, or the like has a large electric resistance, causing problems when wiring is made thin. Moreover, there are the problems in that gold is expensive and silver is likely to migrate.

In order to solve the above-mentioned problems, a ceramic substrate for electronic circuit in which inexpensive copper having a low resistance is used for a conductive layer has been proposed. When a conductive layer and a ceramic layer in the case of a substrate for multilayer electronic circuit are simultaneously fired, or when a conductive layer and an insulated layer in the case of a substrate for printed electronic circuit are simultaneously fired, using e base metal such as copper as the conductive material, a binder in the ceramic layer or the insulated layer and the conductive layer is burnt out by adding water vapor in an inert gas atmosphere in which the conductive layer is not oxidized, and then the ceramic layer or the insulated layer and the conductive layer are fired in an inert gas atmosphere. However, according to this method, the binder is not sufficiently burnt out, causing problems such as remaining carbon. For the purpose of solving this problem, as described in Japanese Laid-Open Patent Publication No. 61-26293, a method comprising the steps of: forming the conductive layer with a copper oxide; burning out the binder in the ceramic layer or the insulated layer and the conductive layer in air; metallizing the conductive layer alone at a low temperature by reduction; and firing the ceramic layer or the insulated layer and the conductive layer in an inert gas atmosphere.

Moreover, as described in U.S. Pat. No. 4,503,090, a method comprising the steps of: diffusing a copper component oxidized from the conductive layer into the ceramic layer on the lower part of the conductive layer; and forming a reaction layer of copper oxide and a ceramic component on the lower part of the conductive layer has been proposed.

However, in a conventional ceramic substrate for electronic circuit having the conductive layer comprising copper or an alloy containing copper as its main component, the copper oxide is partially diffused from the conductive layer to the ceramic layer in the case of the substrate for multilayer electronic circuit or in the insulated layer in the case of the substrate for printed electronic circuit in the course of the production. Thus, defects are caused due to the difference in the firing conditions between the portion in which the copper oxide is diffused and the other portion.

SUMMARY OF THE INVENTION

The ceramic substrate for electronic circuit of this invention, which overcomes the above-discussed and numerous other disadvantages and deficiencies of the prior art, comprises a ceramic layer and a conductive layer which is patterned on the ceramic layer, wherein the conductive layer comprises copper or an alloy containing copper as its main component, and wherein the ceramic layer entirely comprises a complex oxide or an oxide solid solution containing copper element and at least one component excluding copper element, and the ceramic layer is insulated.

In a preferred embodiment, the ceramic layer comprises an oxide selected from the group consisting of a complex oxide, an oxide solid solution, and an oxide complex, the oxide complex containing at least one oxide selected from the group consisting of the complex oxide and the oxide solid solution as its component, wherein each of the complex oxide, the oxide solid solution, and the oxide complex contains copper element, at least one element selected from the group A consisting of strontium, barium, calcium, and lead, and at least one element selected from the group B consisting of tungsten, niobium, and tantalum.

In a preferred embodiment, the content of a copper oxide component in the ceramic layer is in the range of 0.3% to 5% by weight in terms of CuO.

A ceramic substrate for electronic circuit comprises a ceramic substrate, a conductive layer which is patterned on the ceramic substrate and comprises copper or an alloy containing copper as its main component, at least one insulated layer formed so as to cover a portion of the conductive layer, and another conductive layer which is patterned at least on the insulated layer and comprises copper or an alloy containing copper as its main component, wherein the insulated layer entirely comprises a complex oxide or an oxide solid solution containing copper element and at least one component excluding copper element.

In a preferred embodiment, the insulated layer comprises an oxide selected from the group consisting of a complex oxide, an oxide solid solution, and an oxide complex, the oxide complex containing at least one oxide selected from the group consisting of the complex oxide and the oxide solid solution as its component, wherein each of the complex oxide, the oxide solid solution, and the oxide complex contains copper element, at least one element selected from the group A consisting of strontium, barium, calcium, and lead, and at least one element selected from the group B consisting of tungsten, niobium, and tantalum.

In a preferred embodiment, the content of a copper oxide component in the insulated layer is in the range of 0.3% to 5% by weight in terms of CuO.

In a preferred embodiment, the ceramic substrate comprises a complex oxide or an oxide solid solution containing copper element and at least one component excluding copper element.

A method for producing a ceramic substrate for electronic circuit comprises the steps of:

preparing a complex oxide or an oxide solid solution containing copper element and at least one component excluding copper element by reacting a copper oxide with at least one component excluding copper element;

forming ceramic green sheets comprising the complex oxide or the oxide solid solution and a binder;

patterning a conductive layer comprising a binder and a copper oxide or an oxide mainly containing copper element on the ceramic green sheets;

laminating a plurality of the ceramic green sheets to form a laminated body;

heating the laminated body in air so as to burn out the binder comprised in the ceramic green sheets and the conductive layer;

heating the laminated body, in which the binder has been burnt out, in a reducing gas to reduce and metallize the conductive layer; and firing the laminated body, in which the conductive layer has been metallized, in an inert gas atmosphere to sinter the ceramic green sheets and the conductive layer.

A method for producing a ceramic substrate for electronic circuit comprises the steps of:

preparing a complex oxide or an oxide solid solution containing copper element and at least one component excluding copper element by reacting a copper oxide with at least one component excluding copper element;

patterning a conductive layer comprising a binder and a copper oxide or an oxide mainly containing copper element as its main component on a sintered ceramic substrate;

forming at least one insulated layer on the sintered ceramic substrate having the conductive layer so as to cover a portion of the conductive layer, the insulated layer comprising a binder, and the complex oxide or the oxide solid solution;

patterning another conductive layer comprising a binder and a copper oxide or an oxide mainly containing copper element at least on the insulated layer;

heating the sintered ceramic substrate having the conductive layers and the insulated layer in air so as to burn out the binder comprised in the conductive layers and the insulated layer;

heating the sintered ceramic substrate, in which the binder has been burnt out, in a reducing gas to reduce and metallize the conductive layers; and firing the sintered ceramic substrate, in which the conductive layers has been metallized, in an inert gas atmosphere to sinter the conductive layers and the insulated layer.

Thus, the invention described herein makes possible the objective of providing a highly reliable ceramic substrate for electronic circuit which prevents defects caused by the partial diffusion of the copper oxide to the ceramic layer or the insulated layer from the conductive layer.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A ceramic substrate for electronic circuit of the present invention can form two kinds of configurations. One of them is a ceramic substrate for multilayer electronic circuit in which a conductive layer is patterned on a ceramic layer. The other one is a ceramic substrate for printed electronic circuit in which conductive layers patterned and an insulated layer are laminated on a ceramic substrate.

In the ceramic substrate for multilayer electronic circuit, the ceramic layer comprises a complex oxide or an oxide solid solution containing copper element and at least one component excluding copper element, and the conductive layer comprises copper or an alloy containing copper as its main component. The ceramic substrate for multilayer electronic circuit is characterized by the ceramic layer.

In the ceramic substrate for printed electronic circuit, the insulated layer comprises a complex oxide or an oxide solid solution containing copper element and at least one component excluding copper element, and the conductive layer comprises copper or an alloy containing copper as its main component. The ceramic substrate for printed electronic circuit is characterized by the insulated layer.

The ceramic layer or the insulated layer of the ceramic substrate for electronic circuit according to the present invention entirely comprises a complex oxide or an oxide solid solution containing copper element and at least one component excluding copper element. Examples of the component excluding copper element include strontium, barium, calcium, lead, tungsten, niobium, tantalum, alumina and a material containing an ordinary vitreous component and the like. In particular, the complex oxide or the oxide solid solution containing at least one element selected from the group A consisting of strontium, barium, calcium, and lead; at least one element selected from the group B consisting of tungsten, niobium, and tantalum; and copper element is preferred because of a high insulation property and the formation of a perovskite structure.

Instead of the above-mentioned complex oxide or oxide solid solution, the ceramic layer or the insulated layer can comprise an oxide complex containing the above-mentioned complex oxide and/or oxide solid solution as its components.

Moreover, it is preferred that the content of the copper oxide component in the ceramic layer or the insulated layer is in the range of 0.3 to 5.0% by weight in terms of CuO.

Furthermore, it is preferred that the ceramic substrate in the ceramic substrate for printed electronic circuit comprises a complex oxide or an oxide solid solution containing copper element and at least one component excluding copper element, since the ceramic substrate for electronic circuit using such a ceramic substrate can provide a hybrid IC.

When the ceramic layer of the ceramic substrate for multilayer electronic circuit is formed from, what is called, a ceramic green sheet obtained by applying a casting comprising the complex oxide or the oxide solid solution containing copper element and at least one component excluding copper element, a binder, and a solvent on an organic film; drying the casted ceramic green sheet, and removing the organic film, the conductive layer which is patterned on the green sheet and the ceramic layer can be simultaneously fired. Thus, it is preferred that the ceramic layer is formed of the ceramic green sheet. As an ordinary method, a plasticizer such as dibutyl phthalate or the like can be comprised in the ceramic green sheet. The ceramic green sheet can be applied to the insulated layer or the ceramic substrate in the case of the ceramic substrate for printed electronic circuit.

Moreover, when the conductive layer is formed on the ceramic green sheet, a procedure, in which the conductive layer is patterned by using printing ink containing a copper oxide or an oxide mainly containing copper element, a binder, and a solvent, is effective and preferred.

Examples of a binder material comprised in the green sheet include a butyral resin and an acrylic resin. Examples of a binder material comprised in the printing ink include ethyl cellulose and an acrylic resin.

The binder comprised in the ceramic green sheet and the conductive layer is preferably burned out by heating at a temperature of 350° to 700° C. in air for 30 minutes to 10 hours.

When the patterned conductive layer is reduced to be metallized, this portion is heated in a reducing gas. Examples of reducing gases include hydrogen gas or carbon monoxide gas. Hydrogen gas is preferred in terms of cost and safety. The reducing conditions are preferably a temperature in the range of 160° to 550° C.

The green sheets and the conductive layer are fired in an inert gas atmosphere. Inert gas such as nitrogen gas or argon gas whose low partial pressure of oxygen is in the range of $10^{-6}$ to $10^{-3}$ arm is preferably used for this firing. Among the above-mentioned inert gases, nitrogen gas is particularly preferred from the industrial point of view because of inexpensiveness.

The firing conditions are different depending on the various kinds of ceramic materials and on the shapes of the ceramic substrate for electronic circuit and therefore cannot be generally described. For example, the firing temperature is in the range of 700° to 1,000° C. (normally at about 900° C.) when lead containing perovskite is used.

According to the ceramic substrate for electronic circuit having the conductive layer comprising copper or an alloy containing copper as its main component, the ceramic layer in the case of the substrate for multilayer electronic circuit or the insulated layer in the case of the substrate for printed electronic circuit comprise a copper element. This copper element does not exist as a metal or as an oxide containing copper element alone but as a complex oxide or an oxide solid solution containing copper element and at least one component excluding copper element. Thus, the diffusion rate of the copper oxide from the conductive layer to the ceramic layer or the insulated layer becomes low. Moreover, even though the copper oxide is diffused, a certain degree of copper oxide component is entirely comprised in the ceramic layer or the insulated layer, so that a great difference in the firing state between the portion in which the copper oxide is diffused and the portion in which the copper oxide is not diffused is not caused, whereby defects are not likely to occur.

The above-mentioned construction can be achieved by using a complex oxide or an oxide solid solution containing copper element and at least one component excluding copper element obtained by reacting the copper oxide with at least one component excluding copper element as a starting material for the ceramic layer or the insulated layer.

Moreover, according to the production method comprising the above-mentioned step, when the conductive layer comprising the copper oxide or the oxide mainly containing copper element is reduced at a low temperature, the copper oxide or the oxide mainly containing copper element of the conductive layer alone can be selectively reduced. The copper oxide component (which is comprised in the complex oxide or the oxide solid solution) of the ceramic layer or the insulated layer is not readily reduced compared with the copper oxide or the oxide mainly containing copper element which is comprised in the conductive layer, so that the conductive layer alone can be reduced to be metallized in an appropriate period of treating time. Because of this, the ceramic layer or the insulated layer can maintain its characteristics without decreasing the insulation property.

Moreover, the ceramic substrate for electronic circuit of the present invention regulates the diffusion rate of the copper oxide from the conductive layer to the ceramic layer or the insulated layer. Even though the diffusion occurs, a great difference in the firing state between the portion in which the copper oxide is diffused and the portion in which the copper oxide is not diffused is not caused, so that the reliability of the ceramic substrate for electronic circuit having the conductive layer comprising copper or an alloy containing copper as its main component can be improved.

EXAMPLES

The present invention will be described by way of illustrating examples below.

EXAMPLE 1

Figure 1A:
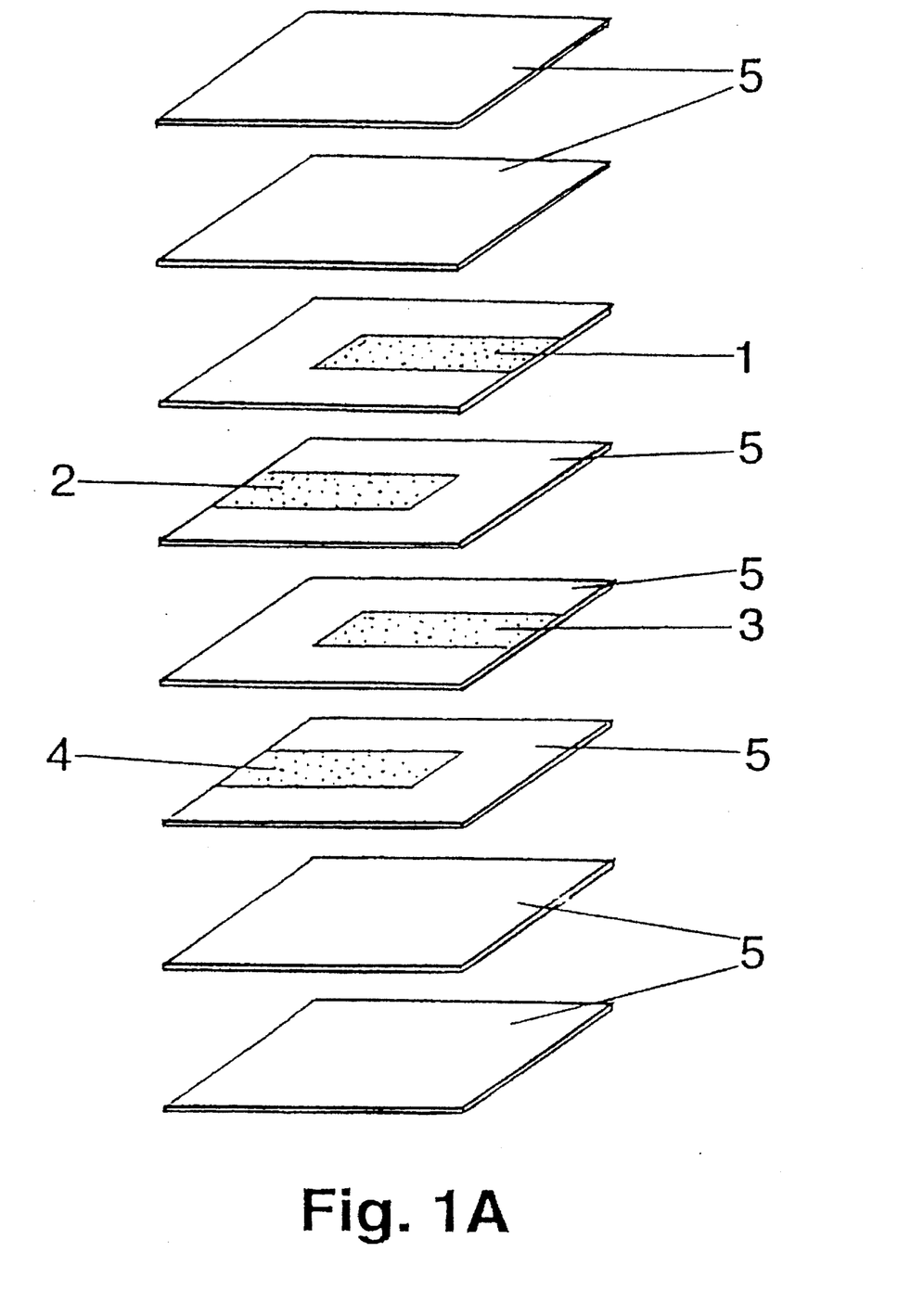
FIG. 1a is a view showing the configuration of a ceramic substrate for multilayer electronic circuit in Example 1.
Figure 1B:
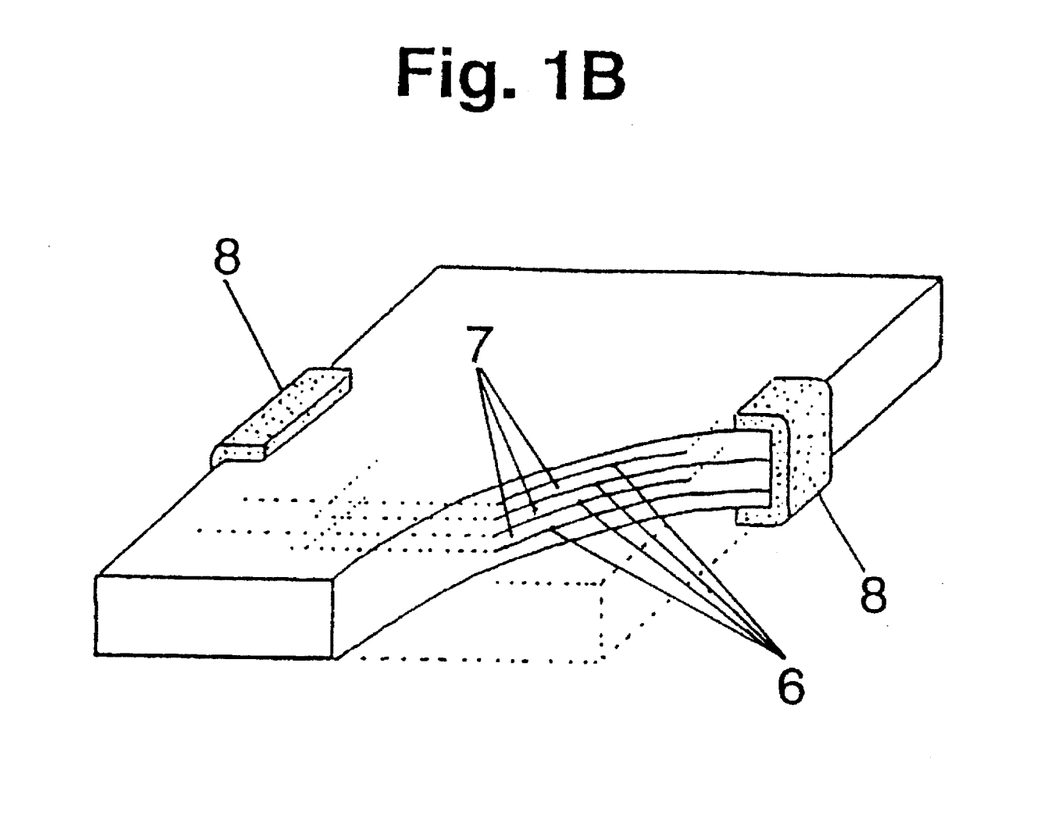
FIG. 1B is a perspective view of the ceramic substrate for multilayer electronic circuit in Example 1.

A ceramic substrate for multilayer electronic circuit will be illustrated with reference to FIGS. 1A and 1B.

First, each starting materials having a ceramic composition shown below were mixed and calcinated at 1,050° C. for 2 hours to obtain a complex oxide. Then, ceramic green sheets were prepared by the ordinary method using a butyral resin and the raw material obtained by grinding the complex oxide.

Predetermined patterns for respective conductive layers 1, 2, 3, 4 were printed on the ceramic green sheets 5 with an electrode paste containing a copper oxide and an ethyl cellulose resin. Four resulting ceramic green sheets and four ceramic green sheets 5 were laminated as shown in FIG. 1A to obtain a laminated body. The laminated body was heated at a temperature of 480° C. in air for 8 hours to burn out the binder comprised in the ceramic green sheets and the conductive layer.

The laminated body in which the binder was burnt out was reduced at a temperature of 220° C. in hydrogen gas for 16 hours, whereby the pattern of the conductive layer was reduced so as to become metallized.

Then, the laminated body was fired at a temperature of 960° C. in an atmosphere of nitrogen gas containing 30 ppm of oxygen for 80 minutes, thereby obtaining a sample. As shown in FIG. 1B, the fired sample had an outer configuration of 40 mm × 40 mm × 2 mm, and had a construction in which 4 conductive metal layers 6 having a width of 10 mm and a thickness of 4 μm in the center were crossed each other with the ceramic layer 7 having a thickness of 120 μm sandwiched therebetween. At the ends of the laminated body, terminal electrodes 8 drawn out of the respective conductive layers were provided. Ten samples for each ceramic composition were obtained. The following evaluations of these ten samples were conducted.

As one evaluation of the reliability of the laminated body thus produced, a DC voltage of 1,200 V was applied between the terminal electrodes of the samples, whereby the number of dielectric breakdowns were examined. As another evaluation of the reliability, other samples produced by the same method as the above were kept in an air-conditioned bath containing 85% water vapor at 85° C. for 500 hours. After that, the samples were allowed to stand for 10 hours so as to dry the surface thereof. A DC voltage of 120 V was applied to each of the resulting samples, which were then examined for insulation resistance by using an insulation resistance tester. The samples having a resistance of $10^7$ Ω or less was determined as defective defects.

Moreover, the ceramic layers of the fired samples were analyzed by a powder X-ray method, whereby the presence of e metallic copper phase, CuO phase, or $Cu_2O$ phase was confirmed.

The six following kinds of the ceramic layer compositions were produced and tested.

A: $Sr_{0.5}Ca_{0.5}(Cu_{1/4}Nb_{3/4})_{0.05}(Mg_{1/3}Nb_{2/3})_{0.90}$
   $(Zn_{1/2}W_{1/2})_{0.05}O_3$ + 2 wt % LiF
B: $Pb_{0.65}Ca_{0.40}(Cu_{2/5}W_{3/5})_{0.06}(Mg_{1/3}Ta_{2/3})_{0.90}$
   $(Ni_{1/2}W_{1/2})_{0.05}$
C: $Pb_{0.55}Ba_{0.50}(Mg_{1/3}Ta_{2/3})_{0.05}(Ni_{1/3}Nb_{2/3})_{0.80}$
   $(Mg_{1/2}W_{1/2})_{0.15}O_3$
D: $Pb_{0.55}Sr_{0.20}Ca_{0.30}(Cu_{1/3}Nb_{2/3})_{0.50}Zr_{0.30}$
   $(Mg_{1/3}Ta_{2/3})_{0.20}O_3$
E: $Al_2O_3$ 55 mol %, $SiO_2$ 20 mol %, MgO 10 mol %,
   ZnO 10 mol %, $Li_2O_3$ 3 mol %, $CuO_2$ 2 mol %
F: $Al_2O_3$ 70 mol %, $SiO_2$ 5 Mol %, $Cu_2O$ 15 mol %,
   $CaF_2$ 10 mol %

C, D, and F are ceramic compositions prepared for comparative examples.

The composition of the ceramic layer, the number of dielectric breakdowns, and the number of resistance defects are shown in Table 1.

TABLE 1

| Sample No. | Composition | Presence of a metallic copper phase, CuO phase, or $Cu_2O$ phase | Number of insulation defects | Number of resistance defects |
|---|---|---|---|---|
| 1 | A | None | 0 | 0 |
| 2 | B | None | 0 | 0 |
| 3 | C | None | 3 | 7 |
| 4 | D | $Cu_2O$ phase and CuO phase | 2 | 5 |

TABLE 1-continued

| Sample No. | Composition | Presence of a metallic copper phase, CuO phase, or $Cu_2O$ phase | Number of insulation defects | Number of resistance defects |
|---|---|---|---|---|
| | | are present | | |
| 5 | E | None | 1 | 1 |
| 6 | F | Metallic copper phase is present | 10 | 10 |

In Table 1, it was confirmed by an X-ray microanalyzer that in the case of Sample No. 3, the copper element was not entirely comprised in the ceramic layer and the copper element was diffused in the vicinity of the portion which was in contact with the conductive layer. When the cross section was observed by microscope, it was found that many defects were caused in the vicinity of the boundary between the portion in which the copper element was diffused and the portion in which the copper element was not diffused.

It was confirmed by an X-ray diffraction analysis of the ceramic layer that in the case of Sample Nos. 4 and 6, a copper metal and an oxide containing copper element alone were present.

On the other hand, in the case of Sample Nos. 1, 2 and 5 of the ceramic substrate for electronic circuit according to the present invention in which the ceramic layer entirely comprises a copper element, and the copper element does not exist as a metal or an oxide containing copper element alone but as a complex oxide or an oxide solid solution containing copper element and at least one component excluding copper element, the insulation property of the ceramic layer was maintained and excellent characteristics having few insulation defects and resistance defects were obtained.

EXAMPLE 2

Figure 2A:
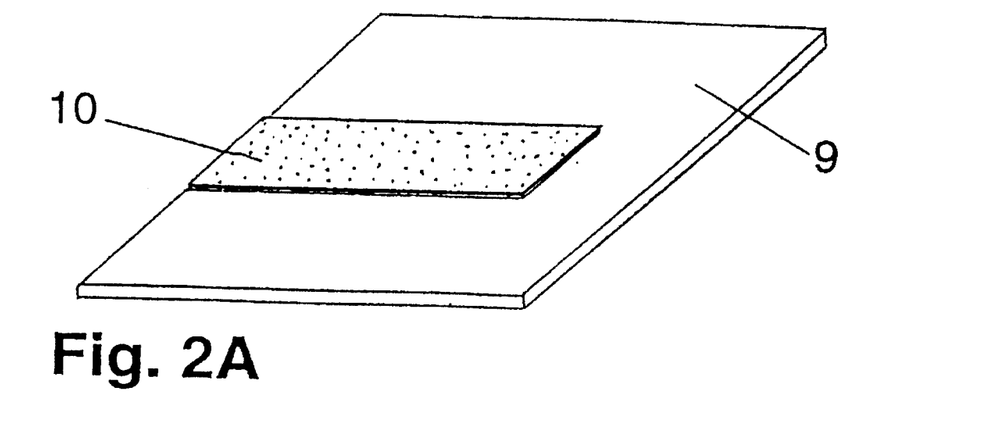
FIGS. 2A, 2B and 2C are views showing the process for producing a ceramic substrate for printed electronic circuit in Example 2.
Figure 2B:
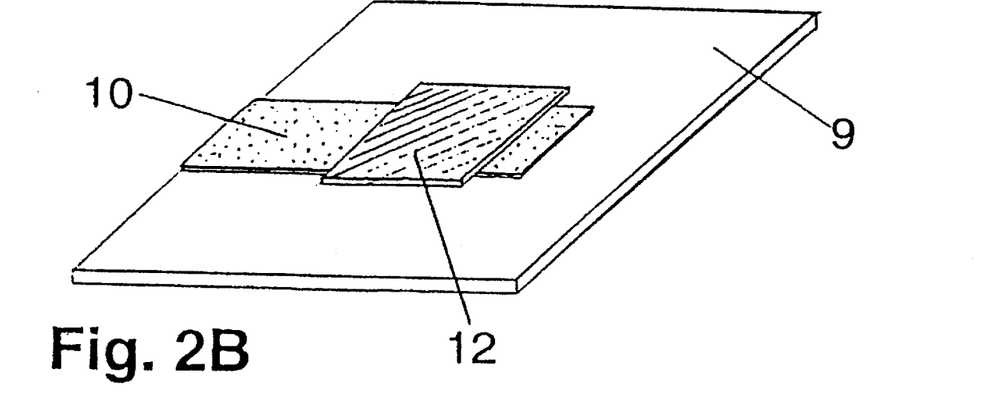
Figure 2C:
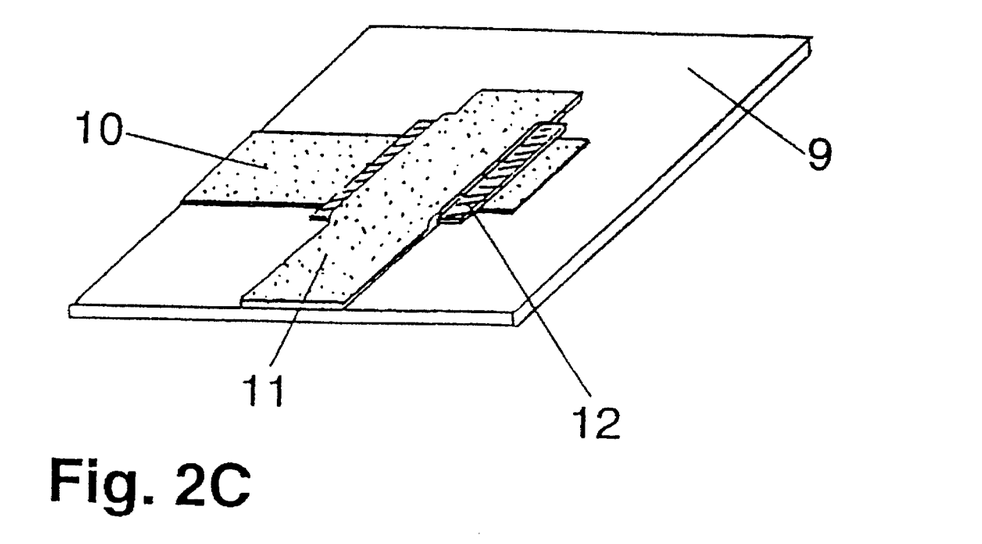

A ceramic substrate for printed electronic circuit will be illustrated with reference to FIGS. 2A, 2B and 2C.

First, 96% alumina-calcia-silica sintered substrate was used as a ceramic substrate 9. A predetermined pattern for the conductive layer 10 was printed on the ceramic substrate 9 with an electrode paste containing a copper oxide, an ethyl cellulose resin and borosilicate zinc glass (FIG. 2A). Each starting materials for the insulated layer having a ceramic composition shown below were mixed and calcinated at a temperature of 1,050° C. for 2 hours to obtain a complex oxide. An insulated ink was prepared by the ordinary method using an ethyl cellulose resin and the raw material obtained by grinding the complex oxide. The insulated layer 12 was formed with the insulated ink so as to cover at least one portion of the conductive layer 10 (FIG. 2B). Further, another conductive layer 11 was patterned at least on the insulated layer 12 (FIG. 2C).

The ceramic substrate having the conductive layers 10, 11 and the insulated layer 12 was heated at a temperature of 500° C. in air for 30 minutes to burn out the binder.

The sintered ceramic substrate 9 having the conductive layers 10, 11 and insulated layer 12 in which the binder was burnt out was reduced at a temperature of 220° C. in hydrogen gas for 16 hours, whereby the conductive layers was metallized. After that, the resulting ceramic substrate was fired at a temperature of 820° C. in an atmosphere of nitrogen containing 70 ppm of oxygen for 6 minutes, thereby obtaining a sample. Fifty samples for each ceramic composition were obtained. The following evaluations of these fifty samples were conducted.

The fired sample comprised the ceramic substrate 9 having a dimension of 40 mm × 40 mm × 1 mm, and had a construction in which 2 conductive metal layers 10, 11 having a width of 10 mm and a thickness of 4 μm in the center were crossed each other with the insulated layer 12 having a thickness of 55 μm therebetween.

As one evaluation of the reliability of the sample thus produced, a DC voltage of 250 V was applied between the terminal electrodes of the samples, whereby the number of dielectric breakdowns were examined. The upper conductive layer was removed by polishing, and the insulated layer in the fired sample was analyzed by the powder X-ray method to confirm the presence of a metallic copper phase, CuO phase or $Cu_2O$ phase.

The six following kinds of the insulated layer compositions were produced and tested.

G: $Sr_{0.5}Ca_{0.5}(Cu_{1/4}Nb_{3/4})_{0.05}(Mg_{1/3}Nb_{2/3})_{0.90}$
   $(Zn_{1/2}W_{1/2})_{0.05}O_3$ + 2 wt % LiF
H: $Pb_{0.65}Ca_{0.40}(Cu_{2/5}W_{3/5})_{0.06}(Mg_{1/3}Ta_{2/3})_{0.90}$
   $(Ni_{1/2}W_{1/2})_{0.05}$
I: $Pb_{0.55}Ba_{0.50}(Mg_{1/3}Ta_{2/3})_{0.05}(Ni_{1/3}Nb_{2/3})_{0.80}$
   $(Mg_{1/2}W_{1/2})_{0.15}O_3$
J: $Pb_{0.55}Sr_{0.20}Ca_{0.30}(Cu_{1/3}Nb_{2/3})_{0.50}Zr_{0.30}$
   $(Mg_{1/3}Ta_{2/3})_{0.20}O_3$
K: $Al_2O_3$ 55 mol %, $SiO_2$ 20 mol %, MgO 10 mol %,
   ZnO 10 mol %, $Li_2O$ 3 mol %, CuO 2 mol %
L: $Al_2O_3$ 70 mol %, $SiO_2$ 5 mol %, $Cu_2O$ 15 mol %,
   $CaF_2$ 10 mol %

I, J, and L are ceramic compositions prepared for comparative examples.

The composition of the insulated layer and the number of dielectric breakdowns are shown in Table 2.

TABLE 2

| Sample No. | Composition | Presence of a metallic copper phase, CuO phase, or $Cu_2O$ phase | Number of insulation defects |
|---|---|---|---|
| 7 | G | None | 2 |
| 8 | H | None | 0 |
| 9 | I | None | 13 |
| 10 | J | $Cu_2O$ phase and CuO phase are present | 8 |
| 11 | K | None | 2 |
| 12 | L | Metallic copper is present | 19 |

In Table 2, it was confirmed by an X-ray microanalyzer that in the case of Sample No. 9, the copper element was not entirely comprised in the insulated layer and the copper element was diffused in the vicinity of the portion which was in contact with the conductive layer. When the cross section of the sample was observed by microscope, it was found that many defects were caused in the vicinity of the boundary between the portion in which the copper element was diffused and the portion in which the copper element was not diffused.

It was confirmed by an X-ray diffraction analysis of the insulated layer that in the case of Sample Nos. 10 and 12, a copper metal and an oxide containing copper element alone were present.

On the other hand, in the case of Sample Nos. 7, 8 and 11 in which the insulated layer entirely comprises a copper element, and the copper element does not exist as a metal or an oxide containing copper element alone but as a complex oxide or an oxide solid solution containing copper element and at least one component excluding copper element, the insulation property of the insulated layer was maintained and excellent characteristics having few insulation defects and resistance defects were obtained.

EXAMPLE 3

A ceramic substrate for printed electronic circuit which is similar to that of Example 2 will be illustrated.

Each sintered substrate having a composition shown in Table 3 was used as a ceramic substrate. The ceramic composition of the insulated layer of Sample No. 8 in Example 2 was used for that of the insulated layer. That is, the composition which was used was $Pb_{0.65}Ca_{0.40}(Cu_{2/5}W_{3/5})_{0.06}(Mg_{1/3}Ta_{2/3})_{0.90}$ $(Ni_{1/2}W_{1/2})_{0.05}O_{3.05}$.

The same procedure as that of Example 2 was repeated. Fifty samples for each ceramic composition were obtained. The following evaluations of these fifty samples were conducted.

As one evaluation of the reliability of the sample thus produced, a DC voltage of 250 V was applied between the terminal electrodes of the samples, whereby the number of dielectric breakdowns were examined. As another evaluation of the reliability, an adhesive tape was attached to the conductive layers, and the contacting state between the conductive layers and the ceramic substrate was observed after the adhesive tape was removed.

The composition of the ceramic substrate, the number of insulation defects, and the number of samples in which the conductive layer was peeled by 1 mm or more are shown in Table 3.

The composition of the ceramic substrate of Sample No. 14 is that of a comparative example.

TABLE 3

| Sample No. | Composition of substrate | Number of insulation defects | Number of peeled samples |
|---|---|---|---|
| 13 | Baked substrate in which 0.84% by weight of CuO is added to 96% alumina—magnesia—silica | 0 | 2 |
| 14 | Baked substrate in which 15.9% by weight of CuO is added to 96% alumina—magnesia—silica | 9 | 2 |

In Table 3, the metallic copper and copper oxide were not detected in the ceramic substrate of Sample No. 13 by the powder X-ray diffraction. However, $Cu_2O$ was detected in the ceramic substrate of Sample No. 14. Because of this, it was stipulated that in Sample No. 14, the insulation defects which caused problems before the peeling test were generated. It was found by examining the conductive layers of Sample Nos. 13 and 14 by the powder X-ray diffraction and fluorescence X-ray analysis that the conductive layers comprised about 3% by weight of metallic lead based on the total weight of metallic copper.

As is apparent from Table 3 and the above-mentioned results, a copper element is comprised in the ceramic substrate having the conductive layers and the insulated layer, in which the copper element does not exist as a metal or an oxide containing copper element alone but as a complex oxide or an oxide solid solution which contains copper element and at least one component excluding copper element. In the ceramic substrate for electronic circuit having such a ceramic substrate, the conductive layers have an improved adhesion with respect to the ceramic substrate compared with a ceramic substrate in which the complex oxide or the oxide solid solution is not comprised.

EXAMPLE 4

A ceramic substrate for multilayer electronic circuit similar to that of Example 1 will be illustrated.

First, as a composition for the ceramic layer, the composition in which CuO of a predetermined amount shown in Table 4 was added to a main component of each oxide shown below was prepared, followed by calcination at 1,050° C. for 2 hours. The material obtained by grinding the resulting mixture and a butyral resin were mixed together with an organic solvent to prepare a ceramic green sheet having a thickness of 150 μm using a doctor blade method. A sample was obtained by using this ceramic green greet in the same way as in Example 1. Ten samples for each ceramic composition were obtained. The following evaluations of these ten samples were conducted.

The evaluations for reliability of the samples were conducted by the ordinary method in the same way as in Example 1. In addition, as severe conditions, the number of dielectric breakdowns was examined by applying a DC voltage of 2,000 V between the terminal electrodes of the samples. Other samples were kept in a saturated water vapor of 125° C. for 500 hours. After that, the samples were allowed to stand in air for 10 hours so as to dry the surface thereof. A DC voltage of 250 V was applied to each of the resulting samples, which were then examined for insulation resistance by using an insulation resistance tester. The samples having a resistance of $10^7$ Ω or less were determined as defective.

The following compositions M and N were used as a main component for the ceramic layers.

M: $Pb_{1.005}(Mg_{1/3}Nb_{2/3})_{0.9}(Ni_{1/2}W_{1/2})_{0.1}O_{3.005}$

N: $Al_2O_3$ 90 wt % $SiO_2$ 8 wt % $CaF_2$ 2 wt %

The added amount of the copper oxide was of five kinds, ranging from 0.1 to 40% by weight based on the total weight.

The main component of the ceramic layer, the number of dielectric breakdowns, and the number of resistance defects are shown in Table 4.

TABLE 4

| Sample No. | Main Component | Content of CuO wt % | under the ordinary conditions | | under the severe conditions | |
|---|---|---|---|---|---|---|
| | | | Insulation defects | Resistance defects | Insulation defects | Resistance defects |
| 15 | M | 0.1 | 0 | 0 | 2 | 1 |
| 16 | M | 0.3 | 0 | 0 | 0 | 0 |
| 17 | M | 1.5 | 0 | 0 | 0 | 0 |
| 18 | M | 5.0 | 0 | 0 | 0 | 0 |
| 19 | M | 7.0 | 0 | 1 | 0 | 3 |
| 20 | N | 0.1 | 0 | 0 | 3 | 0 |
| 21 | N | 0.3 | 0 | 0 | 0 | 0 |
| 22 | N | 1.5 | 0 | 0 | 0 | 0 |
| 23 | N | 5.0 | 0 | 0 | 0 | 0 |
| 24 | N | 7.0 | 0 | 1 | 0 | 6 |

In Table 4, either CuO, $Cu_2O$, or copper oxide was not present in each sample by the X-ray diffraction. Under the ordinary conditions, almost no defects were caused in any samples. However, under severe conditions, when the content of CuO was less than 0.3% by weight, the insulation defects were likely to appear because of the defects in the ceramic layer caused by the partial diffusion of the copper oxide. When the content of CuO was more than 5% by weight, the resistance defects were likely to appear because of the resistance decrease of the ceramic layer itself. Thus, when the content of CuO was in the range of 0.3 to 5% by weight, more preferable characteristics were obtained.

EXAMPLE 5

A ceramic substrate for printed electronic circuit which is similar to Example 2 will be illustrated.

As the ceramic substrate, 96% alumina-calcia-silica sintered substrate similar to that of Example 2 was used.

As a starting material for the insulated layer, a powder obtained by adding CuO of a predetermined amount shown in Table 5 to the same main component as that of Example 4, followed by calcination and grinding was used. A sample was obtained in the same way as in Example 2. Fifty samples for each ceramic composition were obtained. The following evaluations of these fifty samples were conducted. In order to examine the reliability of the samples, a DC voltage of 250 V was applied to the samples to examine the number of dielectric breakdowns in the same as in Example 2. In addition, as a severe testing, a DC voltage of 500 V was applied to examine the number of dielectric breakdowns.

The composition of the insulated portion and the number of dielectric breakdowns obtained when 50 samples were tested ere shown in Table 5.

TABLE 5

| Sample No. | Main Component | Content of CuO wt % | Dielectric breakdown defects at 250V | Dielectric breakdown defects at 500V |
|---|---|---|---|---|
| 25 | M | 0.1 | 1 | 4 |
| 26 | M | 0.3 | 0 | 0 |
| 27 | M | 1.5 | 0 | 0 |
| 28 | M | 5.0 | 0 | 0 |
| 29 | M | 7.0 | 2 | 12 |

TABLE 5-continued

| Sample No. | Main Component | Content of CuO wt % | Dielectric breakdown defects at 250V | Dielectric breakdown defects at 500V |
|---|---|---|---|---|
| 30 | N | 0.1 | 2 | 8 |
| 31 | N | 0.3 | 1 | 0 |
| 32 | N | 1.5 | 0 | 0 |
| 33 | N | 5.0 | 0 | 0 |
| 34 | N | 7.0 | 3 | 16 |

In Table 5, either CuO, $Cu_2O$, or copper oxide was not present in each sample by the X-ray diffraction. Under the ordinary conditions, almost no defects were caused in any samples. However, under severe conditions, when the content of CuO was less than 0.3% by weight or more then 5% by weight, the insulation defects were likely to appear. Thus, when the content of CuO was in the range of 0.3 to 5% by weight, more preferable characteristics were obtained.

As described above, according to the present invention, the ceramic substrate for electronic circuit comprises the ceramic layer in the case of the substrate for multilayer electronic circuit or the insulated layer in the case of the substrate for printed electronic circuit which entirely comprises a complex oxide or an oxide solid solution containing copper element and at least one component excluding copper element. Moreover, a method for producing this kind of ceramic substrate for electronic circuit comprises the steps of: patterning the conductive layer with a copper oxide or an oxide mainly containing copper element for the purpose of preventing the binder from being insufficiently burnt out; reducing only the conductive layer at a low temperature to metallize it after burning out the binder in air; and firing it in an inert gas atmosphere. In the conventional ceramic substrate for electronic circuit in which the copper oxide is generated on the conductive layer in the course of the firing, the copper element is partially diffused into the ceramic layer or the insulated layer, and defects are caused due to the difference in the firing state between the portion in which the copper element is diffused and the portion in which the copper element is not diffused. Thus, the present invention eliminates the defects caused in the conventional ceramic substrate for electronic circuit. Moreover, the present invention is effective in providing a highly reliable ceramic substrate for electronic circuit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A ceramic substrate for a multilayered electronic circuit comprising plural ceramic insulated layers, and plural conductive layers which are patterned on the ceramic layers, the ceramic insulated layers and conductive layers being laminated alternately, wherein the conductive layers comprise metallic copper or an alloy containing metallic copper as its main component, and wherein the ceramic layers entirely comprise a complex oxide or an oxide solid solution containing copper and at least one component other than copper, wherein the complex oxide or the oxide solid solution is prepared by using oxide containing copper as a starting material, whereby the diffusion rate of the copper oxide from the conductive layers to the ceramic layers can be lowered, and wherein each of the complex oxide and the oxide solid solution contains at least one element selected from the group A consisting of strontium, barium, calcium, and lead, and at least one element selected from the group B consisting of tungsten, niobium, and tantalum, so as to form a complex perovskite structure phase.

2. A ceramic substrate for electronic circuit according to claim 1, wherein the content of a copper oxide component in the ceramic layers is in the range of 0.3% to 5% by weight in terms of CuO.

3. A ceramic substrate for electronic circuit comprising a ceramic substrate, a conductive layer which is patterned on the ceramic substrate and comprises copper or an alloy containing copper as its main component, at least one insulated layer formed so as to cover a portion of the conductive layer, and another conductive layer which is patterned at least on the insulated layer and comprises copper or an alloy containing copper as its main component, wherein the insulated layer entirely comprises a complex oxide or an oxide solid solution containing copper and at least one component other than copper, wherein the complex oxide or the oxide solid solution is prepared by using oxide containing copper as a starting material, whereby the diffusion rate of the copper oxide from the conductive layers to the insulated layers can be lowered, and wherein each of the complex oxide and the oxide solid solution contains at least one element selected from the group A consisting of strontium, barium, calcium, and lead, and at least one element selected from the group B consisting of tungsten, niobium, and tantalum, so as to form a complex perovskite structure phase.

4. A ceramic substrate for electronic circuit according to claim 3, wherein the content of a copper oxide component in the insulated layer is in the range of 0.3% to 5% by weight in terms of CuO.

5. A ceramic substrate for a multilayered electronic circuit according to claim 1, wherein copper in the ceramic layers does not exist as a metal or as an oxide containing a copper element alone, as confirmed by an X-ray diffraction analysis.

6. A ceramic substrate for a multilayered electronic circuit according to claim 1, wherein the starting material is prepared by mixing, calcining and grinding.

7. A ceramic substrate for a multilayered electronic circuit according to claim 1, wherein the metallic copper or the alloy containing metallic copper as its main component does not partially diffuse from the conductive layer into the ceramic layer.

8. A ceramic substrate for a multilayered electronic circuit according to claim 1, wherein the ceramic layer is prepared from a composition of the formula:

$Sr_{0.5}Ca_{0.5}(Cu_{1/4}Nb_{3/4})_{0.05}(Mg_{1/3}Nb_{2/3})_{0.90}(Zn_{1/2}W_{1/2})_{0.05}O_3 + 2$ wt % LiF.

9. A ceramic substrate for a multilayered electronic circuit according to claim 1, wherein the ceramic layer is prepared from a composition of the formula:

$Pb_{0.65}Ca_{0.40}(Cu_{2/5}W_{3/5})_{0.06}(Mg_{1/3}Ta_{2/3})_{0.90}(Ni_{1/2}W_{1/2})_{0.05}O_3$.

10. A ceramic substrate for a multilayered electronic circuit according to claim 2, wherein the ceramic layer is prepared from a composition of the formula:

$Al_2O$ 55 mol % + $SiO_2$ 20 mol % + MgO 10 mol % + ZnO 10 mol % + $Li_2O$ 3 mol % + CuO 2 mol %.

11. A ceramic substrate for a multilayered electronic circuit comprising plural ceramic insulated layers, and plural conductive layers which are patterned on the ceramic layers, the ceramic insulated layers and conductive layers being laminated alternately, wherein the conductive layers comprise metallic copper or an alloy containing metallic copper as its main component, wherein the ceramic layers comprise a copper element, and the copper element does not exist as a metal or as an oxide containing copper element alone, as confirmed by x-ray diffraction analysis, wherein the ceramic layers contains at least one element selected from the group A consisting of strontium, barium, calcium, and lead, and at least one element selected from the group B consisting of tungsten, niobium, and tantalum, so as to form a complex perovskite structure phase.

* * * * *

UNITED STATES PATENT AND TRADEMARK OFFICE
CERTIFICATE OF CORRECTION

PATENT NO. : 5,512,353
DATED : April 30, 1996
INVENTOR(S) : Yoichiro Yokotani et al.

It is certified that error appears in the above-indentified patent and that said Letters Patent is hereby corrected as shown below:

Column 1, line 61:
"e base" should read --a base--.

Column 7, line 47:
"$Li_2O_3$" should read --$Li_2O$-- and "$CuO_2$" should read --$CuO$--.

Column 7, line 48: "Mol" should read --mol--.

Column 15, line 4: "$Al_2O$" should read --$Al_2O_3$--.

Signed and Sealed this

Third Day of December, 1996

Attest:

BRUCE LEHMAN

*Attesting Officer*  *Commissioner of Patents and Trademarks*